(12) United States Patent
Boehlke et al.

(10) Patent No.: US 9,183,838 B2
(45) Date of Patent: Nov. 10, 2015

(54) DIGITAL AUDIO TRANSMITTER AND RECEIVER

(71) Applicant: Summit Semiconductor LLC, Hillsboro, OR (US)

(72) Inventors: Kenneth A. Boehlke, Portland, OR (US); Jon C Worley, Portland, OR (US); Jyothi Prakash Noone, Hillsboro, OR (US)

(73) Assignee: SUMMIT SEMICONDUCTOR LLC, Hillsboro, OR (US)

( * ) Notice: Subject to any disclaimer, the term of this patent is extended or adjusted under 35 U.S.C. 154(b) by 55 days.

(21) Appl. No.: 14/050,082

(22) Filed: Oct. 9, 2013

(65) Prior Publication Data

US 2015/0100857 A1    Apr. 9, 2015

(51) Int. Cl.
*G10L 19/005* (2013.01)
*H03M 13/09* (2006.01)
*H03M 13/27* (2006.01)

(52) U.S. Cl.
CPC ........... *G10L 19/005* (2013.01); *H03M 13/096* (2013.01); *H03M 13/2792* (2013.01)

(58) Field of Classification Search
CPC . H04H 20/30; H04H 2201/186; H04H 20/28; H04H 2201/20; H04L 1/0071; H04L 1/0041; H04L 27/2647; H03M 13/09; H03M 13/1515; H03M 13/096; H03M 13/2792; G10L 19/005; H04R 2205/024; H04R 2420/07; H04S 7/30
USPC ........................................................ 714/776
See application file for complete search history.

(56) References Cited

U.S. PATENT DOCUMENTS

| | | | |
|---|---|---|---|
| 5,386,478 A | 1/1995 | Plunkett | |
| 5,534,933 A * | 7/1996 | Yang | 375/240.01 |
| 5,666,424 A | 9/1997 | Fosgate et al. | |
| 6,523,147 B1 * | 2/2003 | Kroeger et al. | 714/792 |
| 7,123,731 B2 | 10/2006 | Cohen et al. | |
| 7,155,017 B2 | 12/2006 | Kim et al. | |
| 7,158,643 B2 | 1/2007 | Lavoie et al. | |
| 7,234,095 B2 * | 6/2007 | Lee et al. | 714/751 |
| 7,272,073 B2 | 9/2007 | Pellegrini et al. | |
| 7,319,641 B2 | 1/2008 | Goudie et al. | |
| 7,496,004 B2 * | 2/2009 | Sako et al. | 369/4 |
| 7,676,044 B2 | 3/2010 | Sasaki et al. | |
| 7,873,120 B2 * | 1/2011 | Kroeger | 375/298 |
| 8,199,941 B2 | 6/2012 | Hudson et al. | |
| 2004/0240573 A1 * | 12/2004 | Yuasa et al. | 375/260 |
| 2005/0251725 A1 * | 11/2005 | Huang et al. | 714/752 |
| 2007/0133813 A1 | 6/2007 | Morishima | |
| 2011/0107176 A1 * | 5/2011 | Song et al. | 714/755 |
| 2014/0314177 A1 * | 10/2014 | Choi et al. | 375/296 |

FOREIGN PATENT DOCUMENTS

WO    2006131893 A1    12/2006

* cited by examiner

*Primary Examiner* — James C Kerveros
(74) *Attorney, Agent, or Firm* — Chernoff, Vilhauer, McClung & Stenzel, LLP

(57) ABSTRACT

A method for increasing the fidelity of digitally encoded audio, for transmitting and receiving a signal comprising digitally encoded packets, and for preserving the power of a signal in transmission including the steps of interleaving the signal, frequency conversion, and polynomial interpolation. The method may also include the step of folding or unfolding the signal. The method may also include the step of detecting missing or damaged elements.

6 Claims, 2 Drawing Sheets

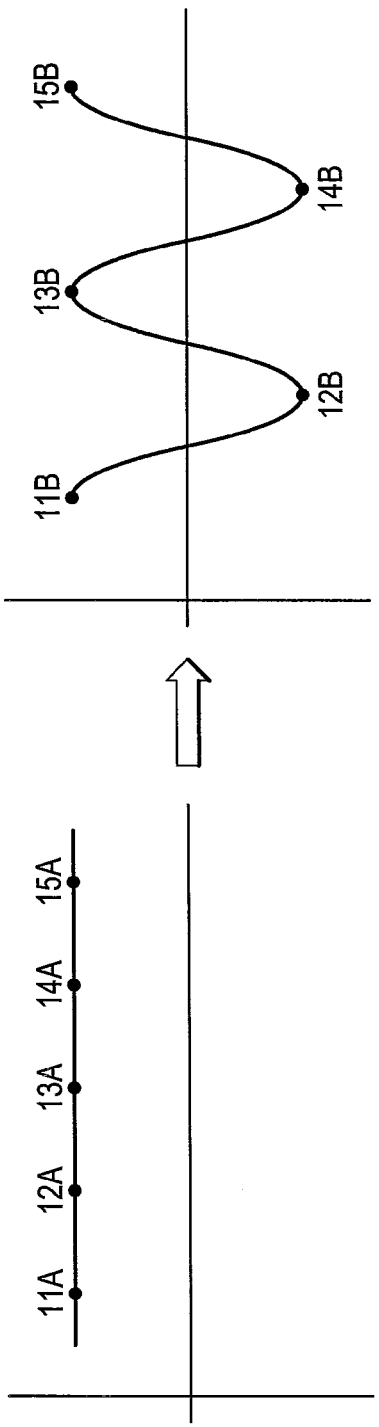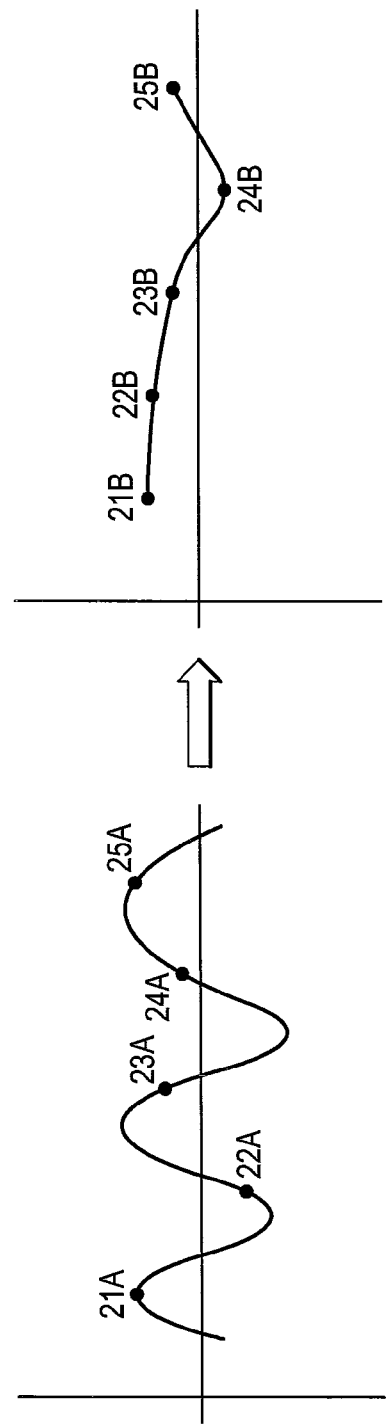

DIGITAL AUDIO TRANSMITTER AND RECEIVER

BACKGROUND OF THE INVENTION

A typical home theater system comprises a display unit, a DVD player or other signal source, an audio video control receiver (AVR), and multiple speakers. The speakers may comprise a center speaker, a subwoofer and two or more pairs (left and right) of surround speakers. The home theater system includes a home theater decoder that creates multiple digital audio signals, which are assigned to the speakers respectively. Each digital audio signal may be composed of a succession of 24-bit samples at a rate of 48 kSa/s. A complete multi-channel audio sample comprises one sample for each channel. Thus, in the case of an eight channel home theater audio system, one multi-channel sample comprises eight 24-bit samples.

The home theater decoder supplies the digital audio signals to the AVR, which converts the digital audio signals to analog form for driving the speakers over wired speaker connections between the AVR and the respective speakers. Alternatively, however, the AVR may include a radio transmitter that transmits the digital audio data wirelessly to radio receivers incorporated in the speakers. In this case, the AVR supplies the digital audio signals to a packetizer, which constructs a transmission packet having a payload that contains the digital audio data for several, e.g. 48, multi-channel audio samples. In the case of the eight channel system, the transmission packet may contain the data for six multi-channel samples.

The radio transmitter employs the transmission packet data bits to modulate a carrier at the frequency of a selected communication channel and transmits the modulated signal via an antenna. In each speaker, a radio receiver receives the modulated signal and detects the modulating transmission packet data bits. An audio processor included in the speaker recovers the digital audio signal assigned to that speaker from the successive transmission packets, converts the digital audio signal to analog form, amplifies the analog audio signal and supplies the audio signal to the audio driver.

It is possible for one or more packets to be lost or damaged in transmission from the AVR to a speaker. This leaves a gap in the sound information and degrades the quality of the reproduction of the audio signal. It is possible to reduce the degradation through various signal processing techniques such as interleaving packets and interpolating between lost or damaged data points.

SUMMARY

A signal to be transmitted is input. The elements are interleaved to minimize the impact of data loss. After transmission and reception, the signal is examined for missing or damaged elements, determined if folding is required, and such elements are estimated using an interpolation process.

The foregoing and other objectives, features, and advantages of the invention will be more readily understood upon consideration of the following detailed description of the invention taken in conjunction with the accompanying drawings.

BRIEF DESCRIPTION OF THE SEVERAL DRAWINGS

FIG. 1 shows the effect of frequency folding on a DC signal.

FIG. 2 shows the effect of frequency folding on a high-frequency signal.

DETAILED DESCRIPTION OF PREFERRED EMBODIMENTS

Figure 3:
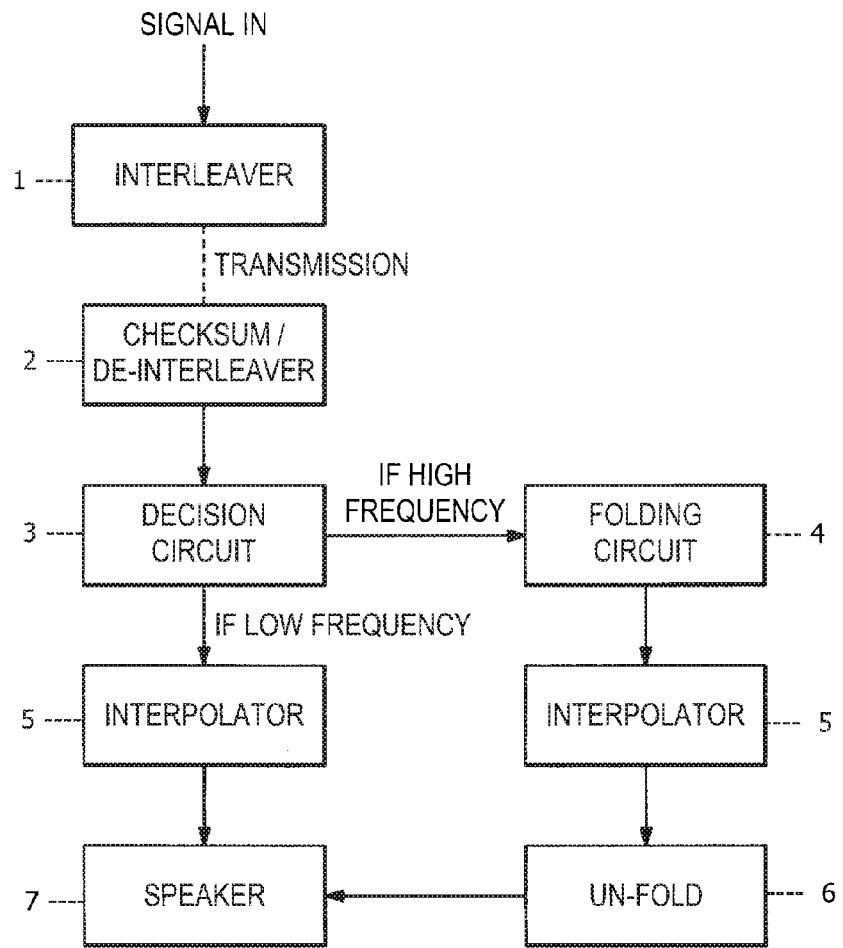
FIG. 3 is a block diagram showing a transmitter and a receiver for a digital audio signal.

It is possible to minimize errors and maximize the quality of sound transmitted through a noisy and/or lossy channel through the use of certain processing techniques. Interleaving a digital signal spreads out a loss over several packets so that it is diluted by good data. A checksum process detects missing or damaged data, making it possible to fill it in by interpolation. "Folding" a signal makes interpolation more accurate for high frequencies by reversibly converting them to lower frequencies, which are easier to interpolate.

Interleaving a signal consists of breaking down packets into their constituent parts and recombining them into new packets comprising parts from each of the packets to be interleaved. In audio transmission, interleaving four packets has been found to provide a good balance between minimizing losses and minimizing processing time. The actual interleaving algorithm may take many forms, but one common and effective form is to divide each packet into the same number of sections as there are packets to be interleaved, then create a new set of interleaved packets, each with one section from each of the old packets.

In one embodiment, using block interleaving, the first new packet may be constructed out of the first section of each old packet, the second new packet may be made from the second section of each old packet, and so on. The process may be represented symbolically, as shown:

$1_1 1_2 1_3 1_4 \quad 2_1 2_2 2_3 2_4 \quad 3_1 3_2 3_3 3_4 \quad 4_1 4_2 4_3 4_4 \text{---}\!\!>\!\!>\!\! 1_1 2_1 3_1 4_1 \ 1_2 2_2 3_2 4_2 \ 1_3 2_3 3_3 4_3 \ 1_4 2_4 3_4 4_4.$ In another embodiment, using recursive interleaving, the process would be represented symbolically at the symbol level as:

$S_n S_{n+1} S_{n+2} S_{n+3} \quad S_{n+k} S_{n+1+k} S_{n+2+k} S_{n+3+k} \text{--}\!\!>\!\!>\!\! S_n S_{n+1-k}$
$S_{n+2-2k} S_{n+3-3k} \ S_{n+k} S_{n+1} S_{n+2-k} S_{n+3-2k}$ Where k=packet length=4, and S=samples. This corresponds to a representation on the packet level as:

$1_1 1_2 1_3 1_4 \ 2_1 2_2 2_3 2_4 \ 3_1 3_2 3_3 3_4 \ 4_1 4_2 4_3 4_4 \ 5_1 5_2 5_3 5_4 \ 6_1 6_2 6_3$
$6_4 \ 7_1 7_2 7_3 7_4 \text{--}\!\!>\!\!>\!\! 4_1 3_2 2_3 1_4 \ 5_1 4_2 3_3 2_4 \ 6_1 5_2 4_3 3_4 \ 7_1 6_2 5_3 4_4$ Interpolation is most effective when performed on DC or low-frequency signals, where large swings between data points do not occur. For sufficiently high frequencies, interpolation is highly unreliable and may not be better than simply omitting a data point. For signal in this range, it is necessary to reversibly convert the signal to a low frequency one to permit accurate interpolation. When interleaving is combined with frequency conversion and polynomial interpolation, high fidelities at reasonable processing speeds are possible.

The interleaved packets are then transmitted, and the reverse process is performed where the packets are received. The de-interleaved packets match the original transmitted packets, assuming no transmission errors. In this way, if an interleaved packet is lost or damaged in transmission, rather than losing all data in one transmission packet, each de-interleaved packet loses only a portion of the data it would normally contain. Thus the damage to accurate sound reproduction is spread out over a longer time period than would otherwise be the case and becomes less noticeable.

Sound quality can be improved still further if it is possible to replace the missing or damaged section of the de-interleaved packet when it is detected. Lost or damaged data can be detected using a checksum process. "Checksum" as used in this application should be construed to encompass error detection regimes that rely on a mathematical manipulation of the data to produce a single datum (in the form of a bit, byte, or word) which can be transmitted along with the data for comparison on the receiving end after the same manipulation is performed. Other possible systems to detect missing or damaged data include, but are not limited to, longitudinal parity checks, Fletcher's checksum, Adler-32, cyclic redundancy checks (CRC), and MD5, all of which are well known in the art of data transmission and error correction.

When the checksum fails and the missing or damaged interleaved packet is identified, the missing or damaged section of each de-interleaved packet can also be identified. Referring to FIG. 2, the checksum process may reveal that the packet $1_2 2_2 3_2 4_2$ is missing or damaged. Thus, the de-interleaved packets may be represented symbolically as shown in FIG. 2 where 24B indicates a missing or damaged section. Then interpolation techniques can be used to estimate the data that the missing or damaged section formerly contained. Polynomial interpolation is an effective and comparatively simply form of interpolation. Given N points, an Nth order polynomial can be fit to the points. The location of the missing or damaged point can then be found on the resulting curve and its value made estimated.

Interpolation of any kind is most effective on curves which change only slightly between points, or in the world of audio, temporal representations of low frequencies. At one extreme, a DC signal requires no interpolation at all. At another extreme, a high-frequency signal might have data points that literally alternate between maxima and minima of the signal, leaving the interpolator with little hope of finding an accurate value using a curve fit. For this reason, "folding" the frequency spectrum at a point where interpolation is still successful is desirable.

This "folding" is accomplished by multiplying the sequence of data points in the signal by the binary sequence that is most closely correlated to the signal. A DC signal will be converted to a high-frequency signal swinging strongly between extremes, as FIG. 1 shows. Points 11A, 13A, and 15A are untouched and become 11B, 13B, and 15B. Points 12A and 14A are converted to 12B and 14B, resulting in a strongly oscillating signal. A high frequency signal such as that shown in FIG. 2 will tend towards becoming a DC signal, as Points 21A, 13A, and 15A retain their original values (show as 21B, 23B, and 25B) while points 22A and 24A are inverted to become 22B and 24B. Note that the high frequency signal will not actually become a DC signal unless the signal is at the same frequency as the samples, but it will nonetheless be altered in to a signal which is more easily and accurately interpolated. In this way, the difficulty of proper interpolation for high frequencies is lowered or eliminated. Once the missing or damaged points have been interpolated, the signal may be "unfolded" by subjecting it to the same process as when it was folded, effectively restoring the original signal with accurately interpolated points in place of gaps in the data.

"Folding" low frequencies will make them harder to interpolate. Therefore, the optimal interpolation will be achieved when only high frequencies are folded and low frequencies are not. Digital audio signals are normally time-domain signals, with the frequencies undifferentiated, and therefore it is impossible to fold only certain frequencies. Instead, the entire signal must be folded. For this reason, the decision to fold or not fold must be made on an ongoing basis, depending on the predominant frequencies in the signal. This decision to fold or not fold can is optimally made relatively frequently, after no more than 100 samples have gone by since the last decision, for a signal having about 48,000 samples per second. The decision is therefore made approximately every 0.002 seconds.

Preferably, the signal is examined by the decision-making circuit before it is passed into the rest of the circuit for reproduction. If high frequencies predominate in a given interval, that interval will be folded before interleaving and transmission. If low frequencies predominate, then it will not be folded. Experimentation has shown that interpolation is very successful up to approximately 10 kHz and degrades in quality after that point. Therefore, in a preferred embodiment, "low" frequencies are below 10 kHz and "high" frequencies are above it.

In one embodiment, the interpoler showed dramatic improvement in fidelity when tested at 48 kHz with a radio link of 18 Mbps. The results of this test are shown at Table 1. Under the older, known methods, signal fidelity began to deteriorate at −76 dBm and suffered step degradation thereafter and decreasing power levels. In contrast, the new interpolator maintained much higher signal fidelity though decreasing power levels, as shown below.

TABLE 1

48 kHz Audio Rate, Radio Link at 18 Mbps

| Attn | RX power level | Old Method | New Interpolator Method |
| --- | --- | --- | --- |
| 67 | −71 | 142 | 142 |
| 68 | −72 | 142 | 142 |
| 69 | −73 | 142 | 142 |
| 70 | −74 | 142 | 142 |
| 71 | −75 | 142 | 142 |
| 72 | −76 | 100 | 142 |
| 73 | −77 | 88 | 142 |
| 74 | −78 | 55 | 120 |
| 75 | −79 | 33 | 100 |
| 76 | −80 | 10 | 75 |
| 77 | −81 | 0 | 10 |
| 78 | −82 | 0 | 0 |
| 79 | −83 | 0 | 0 |

The rapid degradation using the older method is also shown in Table 2.

At an output power of −77 dBm, the signal-to-noise and distortion ratio (SINAD) improves from approximately 90 dB to 140 dB. At −80 dBm, the SINAD improves from approximately 10 dB to 80 dB. This improvement is a 300-1000 times increase in power over known methods.

In another embodiment the interpoler showed dramatic improvement in fidelity when tested at 96 kHz with a radio link of 36 Mbps. The results of this test are shown at Table 3. Under the older, known methods, signal fidelity began to deteriorate at −70 dBm and suffered step degradation thereafter and decreasing power levels. In contrast, the new interpolator maintained much higher signal fidelity though decreasing power levels, as shown below.

TABLE 3

96 kHz Audio Rate, Radio Link at 36 Mbps

| Attn | RX power level | Old Method | New Interpolator Method |
|---|---|---|---|
| 63 | −67 | 145 | 145 |
| 64 | −68 | 145 | 145 |
| 65 | −69 | 145 | 145 |
| 66 | −70 | 120 | 145 |
| 67 | −71 | 99 | 145 |
| 68 | −72 | 63 | 145 |
| 69 | −73 | 50 | 145 |
| 70 | −74 | 45 | 145 |
| 71 | −75 | 40 | 130 |
| 72 | −76 | 35 | 110 |
| 73 | −77 | 20 | 85 |
| 74 | −78 | 15 | 50 |
| 75 | −79 | 0 | 10 |

The rapid degradation using the older method is also shown in Table 4.

The improvement in SINAD here is even more dramatic. At −75 dBm, the SINAD improves from approximately 40 dB under known methods to approximately 130 dB.

FIG. 3 shows in flow diagram an example of the method herein. A signal goes to interleaver (1) and then is transmitted. A checksum/de-interleaver (2) checks the signal. At decision-circuit (3), the signal is determined to be either high or low frequency. If high-frequency, the signal is folded at a folding circuit (4). Once either low frequency or folded, the signal is interpolated at interpolator (5). If necessary, it is unfolded (6) before outputted at speaker (7).

Terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A method of transmitting and receiving a signal comprising digitally encoded packets, comprising the steps of:
   a. Interleaving elements of a predetermined number of packets of a signal;
   b. Determining if the signal should be folded;
   c. Detecting missing or damaged elements;
   d. Estimating the values of the missing or damaged elements by interpolation using a polynomial curve fit; and
   e. Unfolding the signal.

2. The method of claim 1 further comprising the step of folding the signal.

3. The method of claim 1 wherein the missing or damaged elements are detected using a checksum process.

4. The method of claim 1 wherein the missing or damaged elements are detected using a cyclic redundancy check.

5. A method of transmitting and receiving a signal comprising digitally encoded packets, comprising the steps of:
   a. Interleaving the elements of a predetermined number of packets of a signal;
   b. Folding the signal;
   c. Applying a process to detect missing or damages elements of the signal after it has been transmitted;
   d. Applying a polynomial curve to interpolate the values of the missing or damaged elements of the signal; and
   e. Unfolding the signal.

6. A method of preserving the power of a signal in transmission, comprising the steps of:
   a. interleaving the elements of an original signal to be transmitted at a 48 kHz audio rate with radio link at 18 Mbps,
   b. transmitting the signal,
   c. interpolating values for missing or damaged elements detected in a checksum process or cyclic redundancy process, and
   d. unfolding the signal; where the unfolded signal has a SINAD greater than 60 dB and a received power level of −80 dBm to −71 dBm.

* * * * *

UNITED STATES PATENT AND TRADEMARK OFFICE
CERTIFICATE OF CORRECTION

PATENT NO. : 9,183,838 B2  
APPLICATION NO. : 14/050082  
DATED : November 10, 2015  
INVENTOR(S) : Kenneth A. Boehlke It is certified that error appears in the above-identified patent and that said Letters Patent is hereby corrected as shown below:

In The Specification

Column 4, line 52 "The rapid degradation using the older method is also shown in Table 2." should be deleted.

Column 5, line 18 "The rapid degradation using the older method is also shown in Table 4." should be deleted.

Signed and Sealed this  
Twelfth Day of April, 2016

Michelle K. Lee  
*Director of the United States Patent and Trademark Office*